United States Patent
Hamada et al.

[11] Patent Number: 5,376,309
[45] Date of Patent: Dec. 27, 1994

[54] BORIDE MATERIALS FOR ELECTORNIC ELEMENTS AND METHOD OF PREPARING THE SAME

[75] Inventors: Kazuyuki Hamada; Nobuyuki Sugii; Mitsunobu Wakata; Kohichi Kubo; Kiyotaka Matsuura; Hisao Yamauchi, all of Tokyo, Japan

[73] Assignees: International Superconductivity Technology Center, Tokyo; Hokkaido Electric Power Co., Sapporo, both of Japan

[21] Appl. No.: 116,534

[22] Filed: Sep. 3, 1993

[30] Foreign Application Priority Data

Sep. 8, 1992 [JP] Japan .................. 4-239268

[51] Int. Cl.$^5$ .......................... H01B 1/00; H01B 1/02
[52] U.S. Cl. .................... 252/520; 252/518; 423/111; 423/115; 423/276; 423/297
[58] Field of Search ............... 252/518, 520; 423/111, 423/115, 276, 297

[56] References Cited

PUBLICATIONS

B. Post & F. W. Glaser, Trans. AIME, 194, 1952 pp. 631–632.
Matkovich et al., Acta Crystallogr., 19, 1965, pp. 1056.
B. T. Matthias et al., Science, 159, 1969, pp. 530.

Primary Examiner—Paul Lieberman
Assistant Examiner—M. Kopec
Attorney, Agent, or Firm—Kanesaka & Takeuchi

[57] ABSTRACT

Disclosed is a boride material for electronic elements, which is represented by a chemical formula of $A_{1-x}E_xB_{12}$ (where A is Zr of Hf, E is Sc or Y, and $0.1 \leq x \leq 0.9$) and the crystal system of which is a cubic one at a temperature not lower than its phase transition temperature and is a hexagonal one at a temperature not higher than its phase transition temperature. The boride material is prepared by mixing oxide powders or sulfate powders of the constitutive elements A and E and a boron powder followed by shaping the powder mixture and then sintering the shaped body.

3 Claims, 9 Drawing Sheets

BORIDE MATERIALS FOR ELECTORNIC ELEMENTS AND METHOD OF PREPARING THE SAME

FIELD OF THE INVENTION

The present invention relates to a boride material for electronic elements and a method of preparing the same. In particular, it relates to a boride material for electronic devices, which is used as a pn junction element and has a novel function of losing the pn junction at a certain temperature, and also to a method of preparing the same.

DESCRIPTION OF THE RELATED ART

Heretofore, it has been reported that the crystal system of $ZrB_{12}$ is a cubic one having a structure of $UB_{12}$ type and having a lattice constant of a=7.408 Å (B. Post & F. W. Glaser, Trans. AIME, 194, 1952, 631–632). On the other hand, it has been reported that the crystal system of $ScB_{12}$ is a tetragonal one having a random structure of $UB_{12}$ type and having a lattice constants of a=5.22 Å and c=7.35 Å (Matkovich et al., Acta Crystallogr., 19, 1965, 1056). In addition, it has also been reported that both $ZrB_{12}$ and $ScB_{12}$ become superconductive at a low temperature and that the critical temperatures of them are 6.03° K. and 0.39° K., respectively (B. T. Matthias et al., Science, 159, 1969, 530).

As mentioned above, there are reports of reporting the individual crystal systems of $ZrB_{12}$ and $ScB_{12}$, but there is no report of reporting a mixed crystal system $(Zr_{1-x}Sc_x)B_{12}$ composed of the both crystal systems of these $ZrB_{12}$ and $ScB_{12}$.

On the other hand, it has been known that where crystal systems each having a different number of valences and being therefore delicately different from each other in the crystal morphological form are mixed together, a mixed crystal material having a novel function is formed due to the lattice strain to be generated in the mixed crystal system. Therefore, it is considered that a mixed crystal system comprising $ZrB_{12}$ and $ScB_{12}$, if formed, would also involve any novel possibility.

OBJECT AND SUMMARY OF THE INVENTION

The present invention has been made in consideration of the above-mentioned prior art situation, and its object is to provide a boride material for electronic elements, which material comprises two known substances of, for example, $ZrB_{12}$ of a cubic system and $ScB_{12}$ of a tetragonal system and has a novel function.

The boride material for electronic elements of the present invention is represented by a chemical formula of $A_{1-x}E_xB_{12}$ (where A is Zr or Hf, E is Sc or Y, and $0.1 \leq x \leq 0.9$), and its crystal system is characterized by being a cubic one at a temperature not lower than its phase transition temperature and a hexagonal one at a temperature not higher than its phase transition temperature.

In accordance with the present invention, there is provided a boride material for electronic elements by mixing two different crystal systems each having a different number of valences and being therefore delicately different from each other in the crystal morphological form, and the boride material has the following novel functions:

(1) The carrier bearing the electroconductivity varies from the n type to the p type at the phase transition temperature.

(2) The resistivity depends upon the ambient temperature, and it increases at the phase transition temperature.

(3) The magnetic susceptibility depends upon the ambient temperature, and it decreases at the phase transition temperature.

(4) The phase transition temperature varies, depending upon the variation of the composition (x).

DESCRIPTION OF THE PREFERRED EMBODIMENTS

Figure 1:
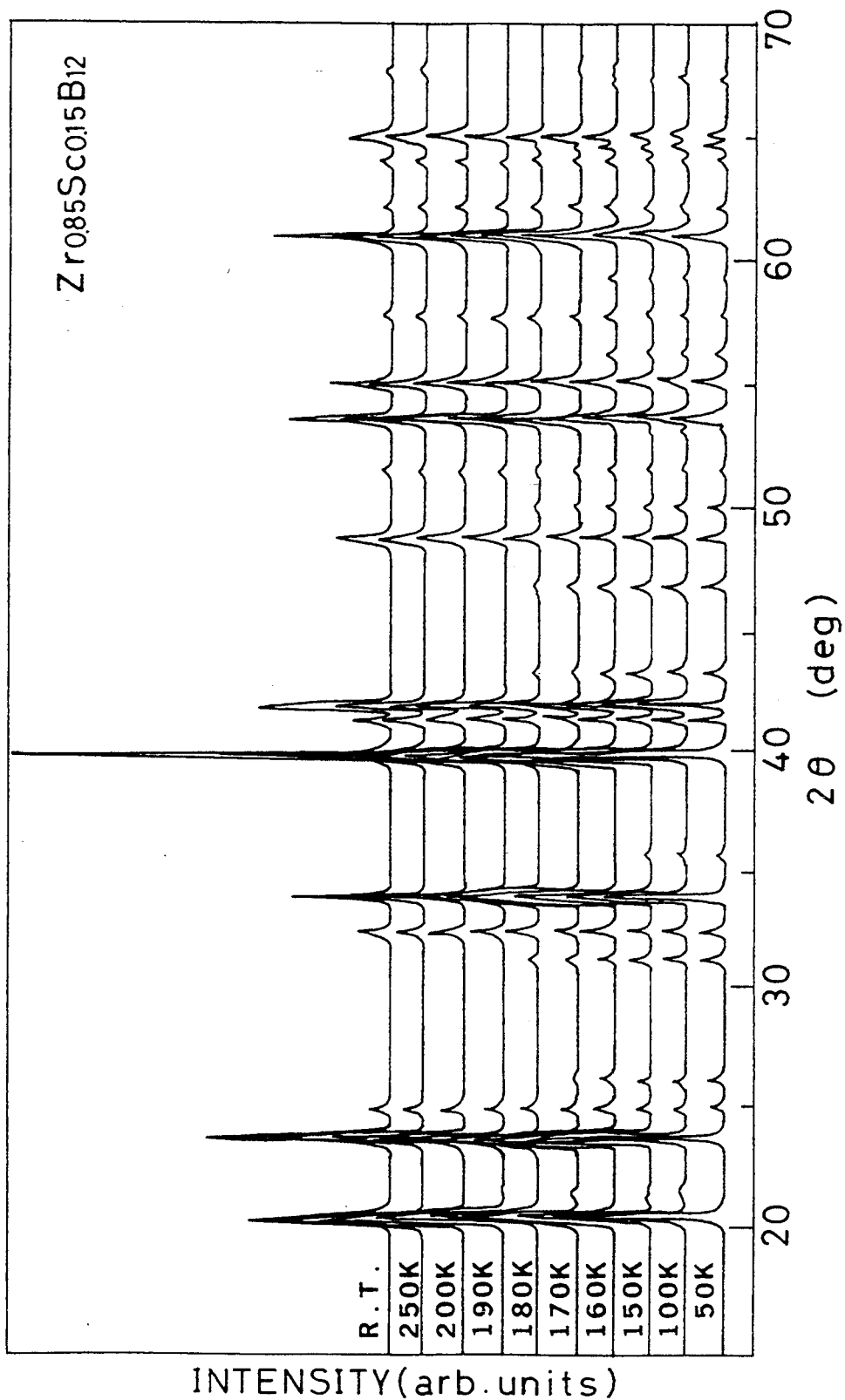
FIG. 1 is a graph of X-ray diffraction patterns at a low temperature, which shows the variation of the crystal structure of sintered ceramics of $Zr_{0.85}Sc_{0.15}B_{12}$.

The present invention will be explained in detail hereunder.

In the chemical formula of $A_{1-x}E_xB_{12}$ of representing the boride material for electronic elements of the present invention, where x is less than 0.1, the crystal structure of the material does not vary from the cubic system of the material where x=0, such as $ZrB_{12}$. In the case, therefore, variation of various physical properties (electric resistivity, magnetic susceptibility, Seebeck coefficient, etc.) to be caused by the phase transition of the crystal structure could not be observed. On the contrary, if x is more than 0.9, the peaks to be caused by the novel crystal structure, which are shown in the X-ray diffraction at room temperature, would be lost so that the peaks of the tetragonal system of the structure where x=1, such as $ScB_{12}$, are observed. As a result, x is defined to fall within the range of $0.1 \leq x \leq 0.9$, preferably $0.15 \leq x \leq 0.8$, which causes variation of the characteristics.

Where x falls within the defined range, the boride material of the present invention of $A_{1-x}E_xB_{12}$ may have a cubic system at a high temperature, while having a hexagonal system at a low temperature, and it is in the form of a mixed crystal comprising cubic and hexagonal crystals at about a temperature for causing the phase transition from the cubic system to the hexagonal system (phase transition temperature). The material shows such a specific behavior that the thermoelectric power characteristic varies from the p type to the n type or from the n type to the p type at its phase transition temperature.

The boride material for electronic elements of the present invention may easily be prepared by mixing powders of oxides of its constitutive elements A and E, such as $ZrO_2$, $HfO_2$, $Sc_2O_3$ of $Y_2O_3$, or powders of sulfates of them, such as $Y_2(SO_4)_3$, $Sc_2(SO_4)_3$ or the like and a powder of boron (B), followed by shaping the mixture and then sintering the shaped body. For shaping the mixture, various methods such as press shaping may be employed.

The condition for sintering the shaped body is not specifically defined. However, it is necessary to sinter it in vacuum of $10^{-2}$ torr or less at a temperature not lower than 1800° C. The reason is because the heterologous phase structure of $MB_2$ (where M is Zr, Sc, Hf or the like) is stable at a temperature not higher than 1800° C., but when the body is heated at 1800° C. or higher, the $MB_2$ structure may disappear. The sintering temperature is preferably from 1800° to 2000° C., more preferably from 1810° to 1900° C. It is unnecessary to specifically define the sintering time because the desired crystal structure, after having been constructed, may exist stably. In a general case, the time may be from 5 minutes to 10 hours, preferably from 15 minutes to 2 hours.

Since B is removed as BO during the sintering due to the reaction between the oxygen and the boron in the starting material, it is preferred the raw material powder mixture is prepared to contain a somewhat larger amount of B powder than the content of B in the intended composition in consideration of the loss of B during the sintering. Precisely, it is preferred that the content of the B powder in the raw material powder mixture is larger than that of B in the intended composition by from 5 to 30 %, especially preferably from 10 to 20%.

Using the boride material for electronic elements of the present invention, a pn junction element may easily be produced. In addition, by varying the composition of the material, an electronic element having such a novel function that the pn junction disappears at a particular temperature to be changed to the p type or to the n type may be provided. Moreover, using the boride material for electronic elements of the present invention, a resistor having a heat sensitivity variable and selectable in accordance with the variation of the composition of the material may easily be produced.

The present invention will be explained in more detail by way of the following examples, which, however, are not intended to restrict the scope of the present invention. Without overstepping the gist and the spirit of the invention, the present invention includes other various modifications than the illustrated embodiments.

EXAMPLE 1

Sintered ceramics of $Zr_{0.85}Sc_{0.15}B_{12}$ was prepared in the manner as mentioned below.

Precisely, a powder mixture comprising powders of $ZrO_2$, $Sc_2O_3$ and B as mixed in an agate mortar to have a molar ratio of Zr/Sc/B of being 0.85/0.15/13.925 was molded by compression molding to form a shaped body having a size of $5 \times 30 \times 2$ mm. The shaped body was put in a cap-combined BN susceptor and sintered in a vacuum furnace equipped with a carbon heater to produce ceramics. In the sintering, gas purging from the vacuum furnace was effected roughly with a rotary pump and then essentially effected with a turbopump to have a final vacuum degree of $2 \times 10^{-3}$ torr or less. Under the vacuum condition, the temperature in the furnace was elevated up to 1820° C. over a period of 20 minutes, then it was kept as it was for one hour and thereafter lowered to room temperature over a period of one hour. During the process, the oxygen in the raw material powder mixture reacted with the excess boron therein to give BO, which was then removed from the sintering system. In the manner, the intended sintered body of $Zr_{0.85}Sc_{0.15}B_{12}$ was obtained.

FIG. 1 shows the X-ray diffraction patterns of the ceramics obtained, at a low temperature. From FIG. 1, appearance of novel peaks at a temperature not higher than 180° K. is noted. By electron diffraction photography, the structure of the ceramics at a temperature not higher than 180° K. was found to have a hexagonal system with a length of the a axis of 5.181 Å and a length of the c axis of 25.41 Å.

Figure 2:
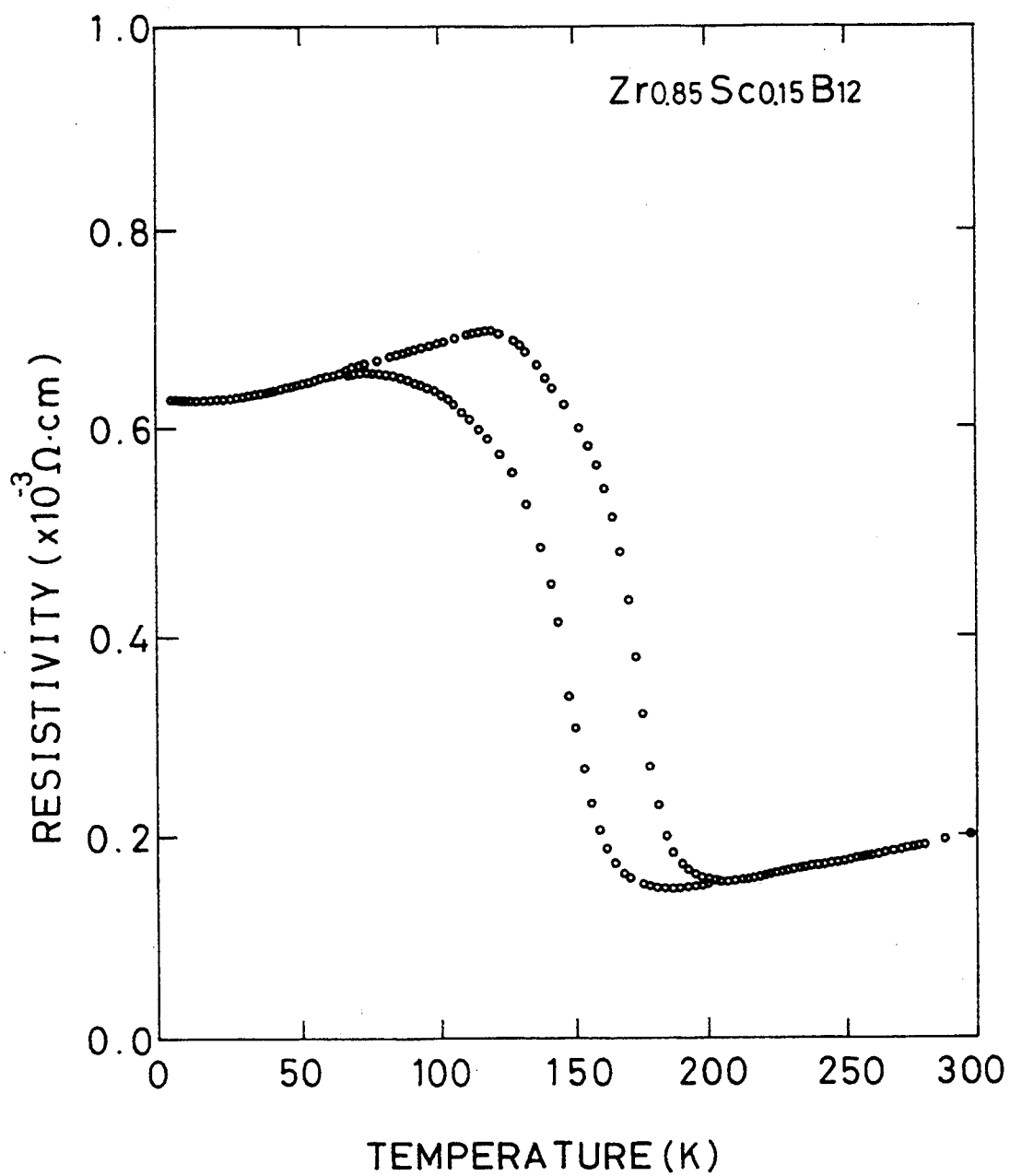
FIG. 2 is a graph of showing the temperature dependence of the electric resistance of ceramics of $Zr_{0.85}Sc_{0.15}B_{12}$.

FIG. 2 shows the temperature dependence of the electric resistance of the ceramics. From FIG. 2, increase of the resistivity with a temperature-dependent hysteresis is noted at a temperature not higher than 200° K.

Figure 3:
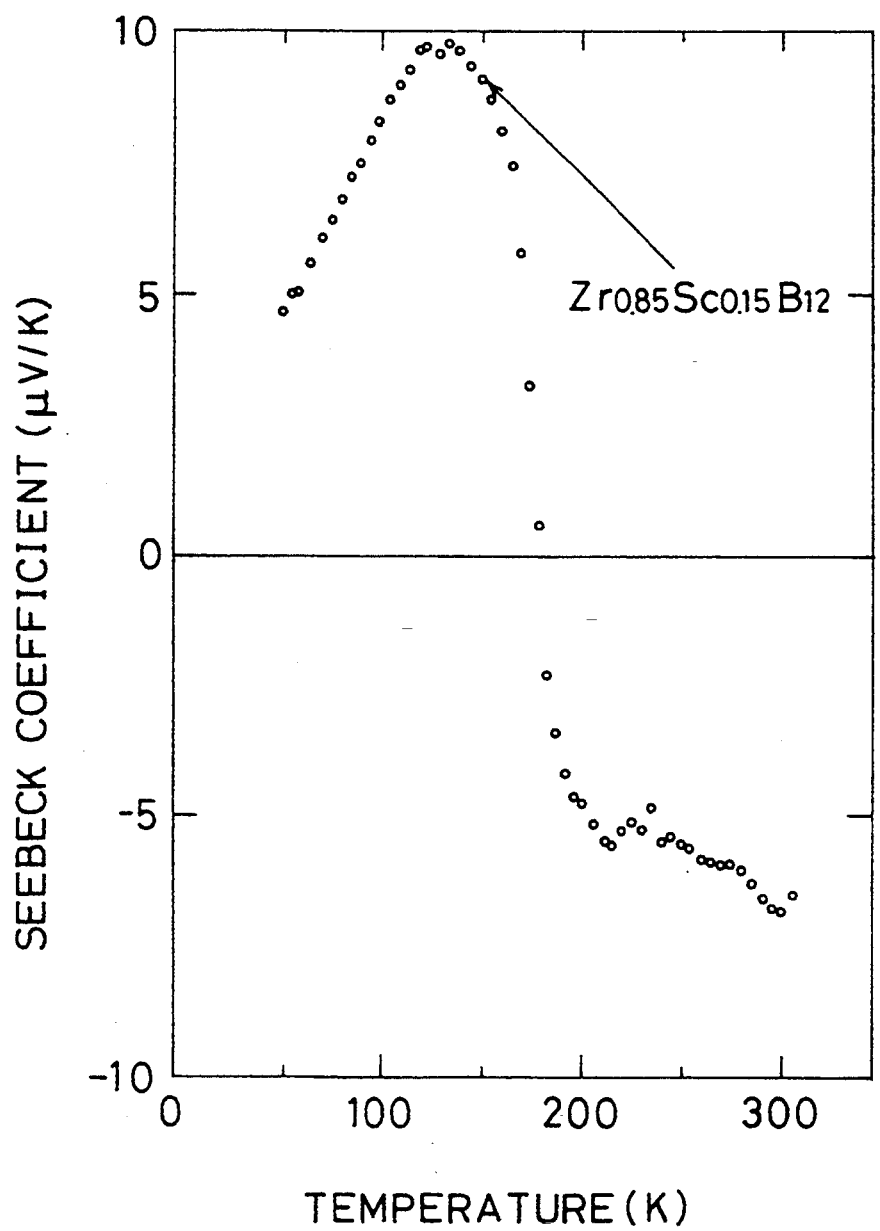
FIG. 3 is a graph of showing the temperature dependence of the Seebeck coefficient of ceramics of $Zr_{0.85}Sc_{0.15}B_{12}$.

FIG. 3 shows the temperature dependence of the Seebeck coefficient of the ceramics. From FIG. 3, increase of the Seebeck coefficient is noted from 200° K. in correspondence with the behavior of the temperature dependence of the electric resistance, with which it is understood that the n type metallic behavior changed to the p type metallic one.

Figure 4:
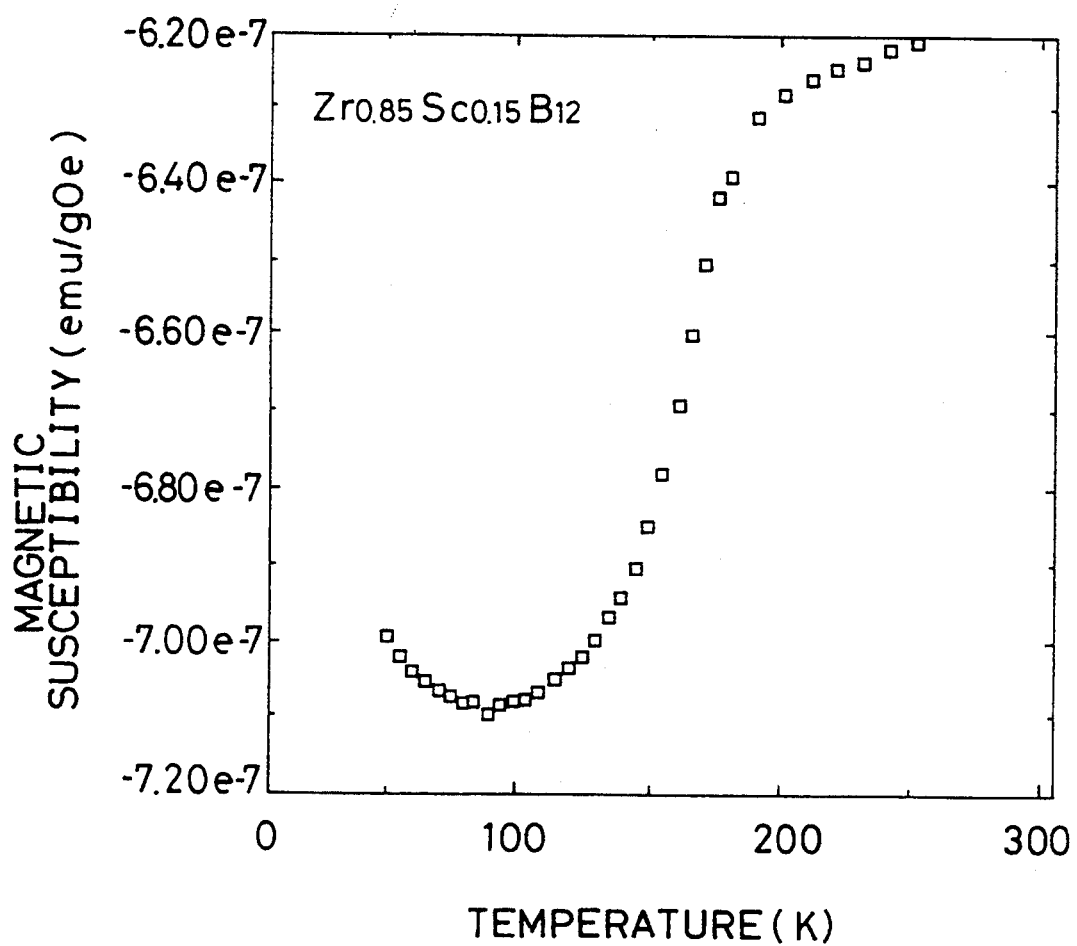
FIG. 4 is a graph of showing the temperature dependence of the magnetic susceptibility of ceramics of $Zr_{0.85}Sc_{0.15}B_{12}$.

FIG. 4 shows the temperature dependence of the magnetic susceptibility of the ceramics. From FIG. 4, it is noted that the substance of the ceramics is a diamagnetic one and rapid increase of the diamagnetism of the body is noted at a temperature corresponding to the variations of its crystal structure, electric resistance and Seebeck coefficient.

Other samples than the illustrated sample comprising the combination of A=Zr and E=Sc were also prepared in the same manner as in Example 1, and the temperature dependence of the resistance of each sample was measured in the same manner. From the measured data, it was verified that the phase transition temperature of each sample varies, depending upon the variation of its composition (x).

EXAMPLE 2

Samples were also prepared in the same manner as in Example 1, except that the molar ratio of Zr/Sc/B was varied to be (1-x)/x/(14-x/2). From them, it was verified that the samples of falling within the range of $0.1 \leq x \leq 0.9$ satisfy the variations of their crystal structure, electric resistance, Seebeck coefficient and magnetic susceptibility. For comparison, the variation, if any, of the electric resistance of a sample of $ScB_{12}$ (x=1) was also checked.

Figure 5:
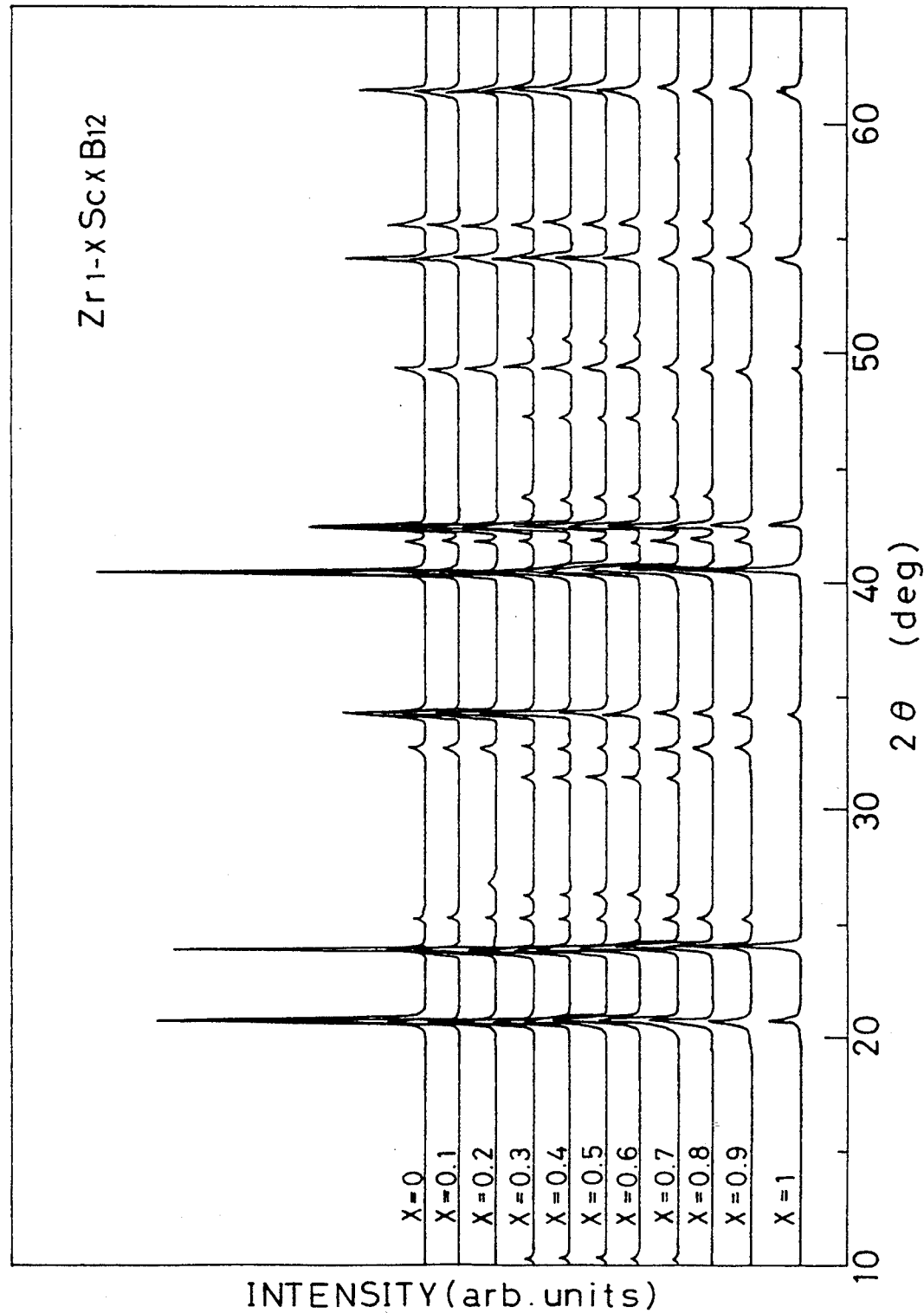
FIG. 5 is a graph of X-ray diffraction patterns of showing the crystal structure of ceramics of $Zr_{1-x}Sc_xB_{12}$ ($0 \leq x \leq 1$) at room temperature.

FIG. 5 shows the X-ray diffraction patterns of the samples of $Zr_{1-x}Sc_xB_{12}$ at room temperature, relative to the variation of x. From FIG. 5, appearance of the peaks of indicating the novel crystal structure to be seen in the X-ray diffraction pattern of the composition of x=0.15 at a low temperature is noted within the range of $0.3 \leq x \leq 0.9$.

Figure 6:
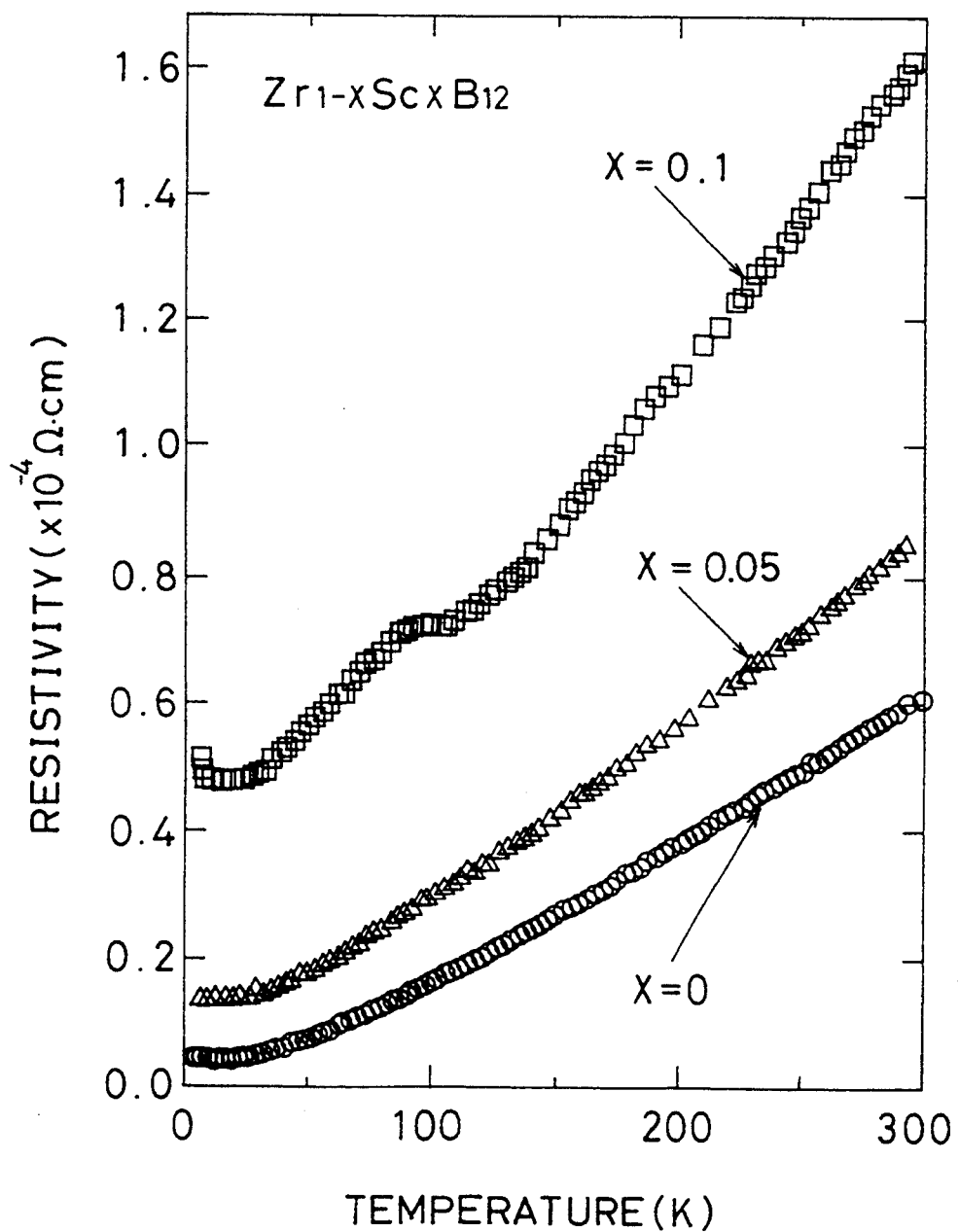
FIG. 6 is a graph of showing the temperature dependence of the electric resistance of ceramics of $Zr_{1-x}Sc_xB_{12}$ ($0 \leq x \leq 0.3$).
Figure 7:
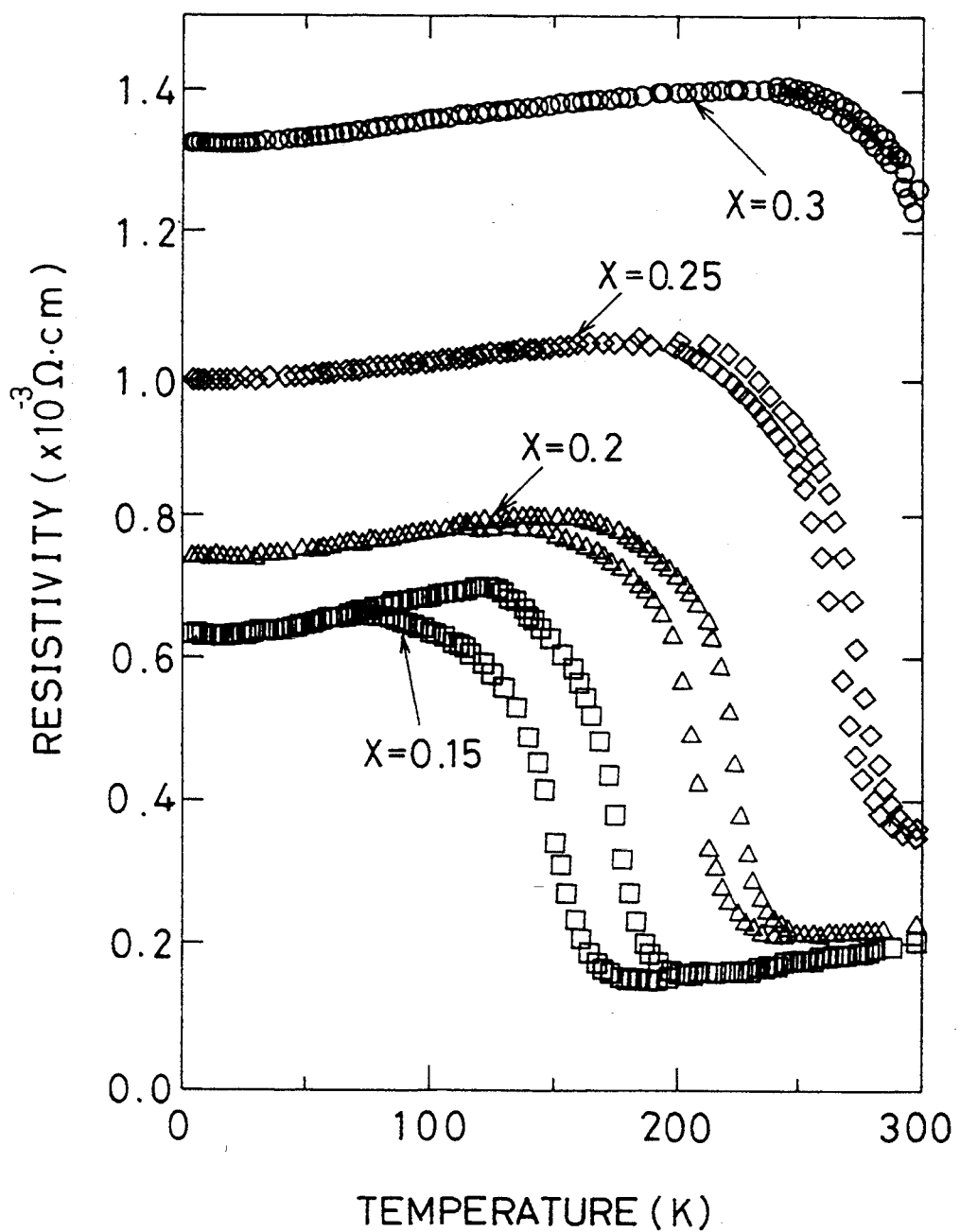
FIG. 7 is a graph of showing the temperature dependence of the electric resistance of ceramics of $Zr_{1-x}Sc_xB_{12}$ ($0 \leq x \leq 0.3$).

FIGS. 6 and 7 each show the temperature dependence of the electric resistance of the compositions of satisfying $0 \leq x \leq 0.3$, relative to the variation of x. From them, it is noted that the temperature to cause the variations of the properties of the compositions is elevated along with the increase of x. Specifically, it is noted that the temperature to cause the variations of the properties of the compositions of satisfying the range of $x \geq 0.3$ is not lower than room temperature.

Figure 8:
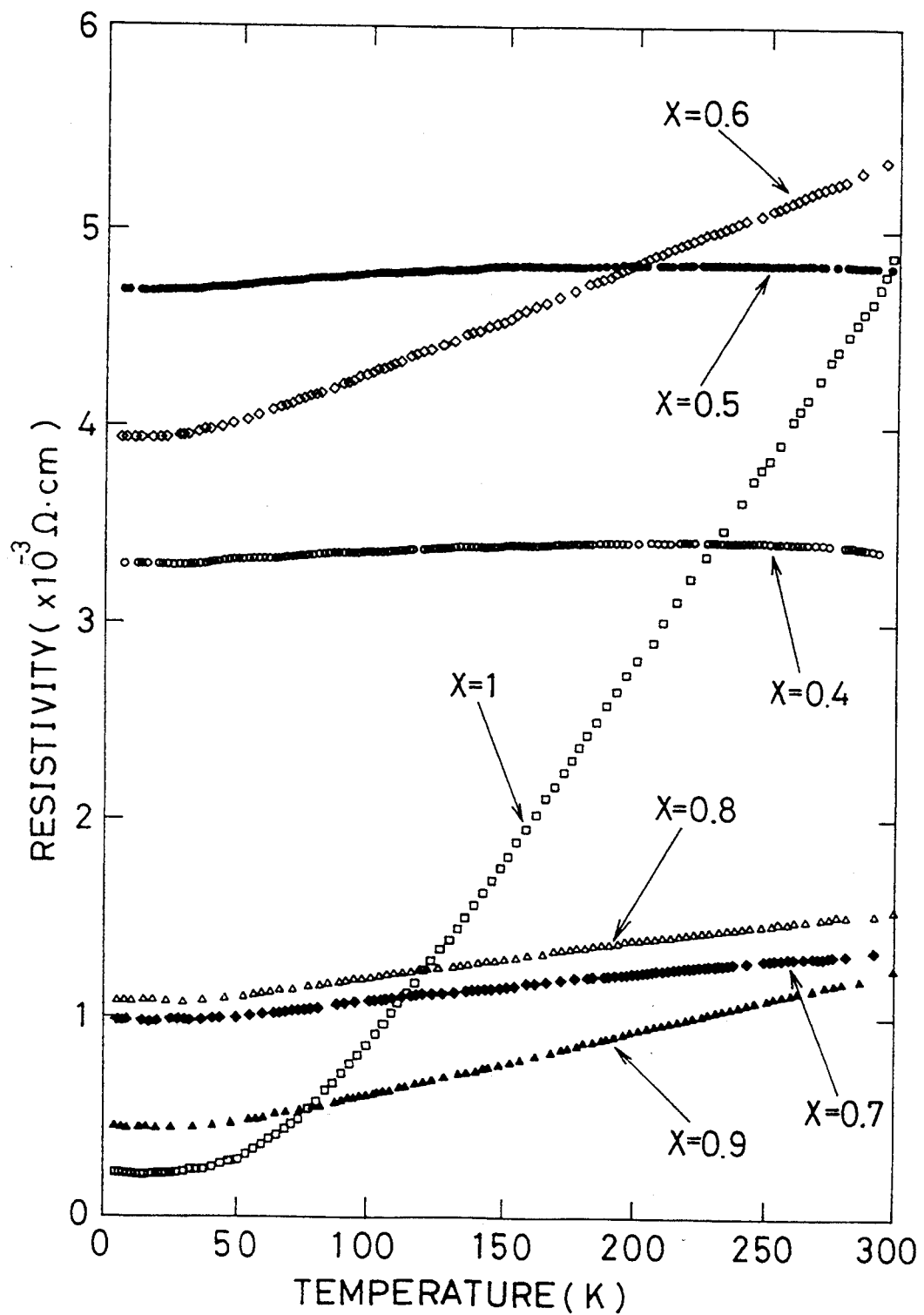
FIG. 8 is a graph of showing the temperature dependence of the electric resistance of ceramics of $Zr_{1-x}Sc_xB_{12}$ ($0.4 \leq x \leq 0.9$) and that of $ScB_{12}$.

FIG. 8 shows the temperature dependence of the electric resistance of samples of satisfying $0.4 \leq x \leq 0.9$ and that of a sample of $ScB_{12}$ (x=1). From FIG. 8, it is noted that the phase transition temperatures of the samples of satisfying $x \geq 0.4$ are shifted to a higher temperature range so that they are not in the range of 300° K. or lower.

Figure 9:
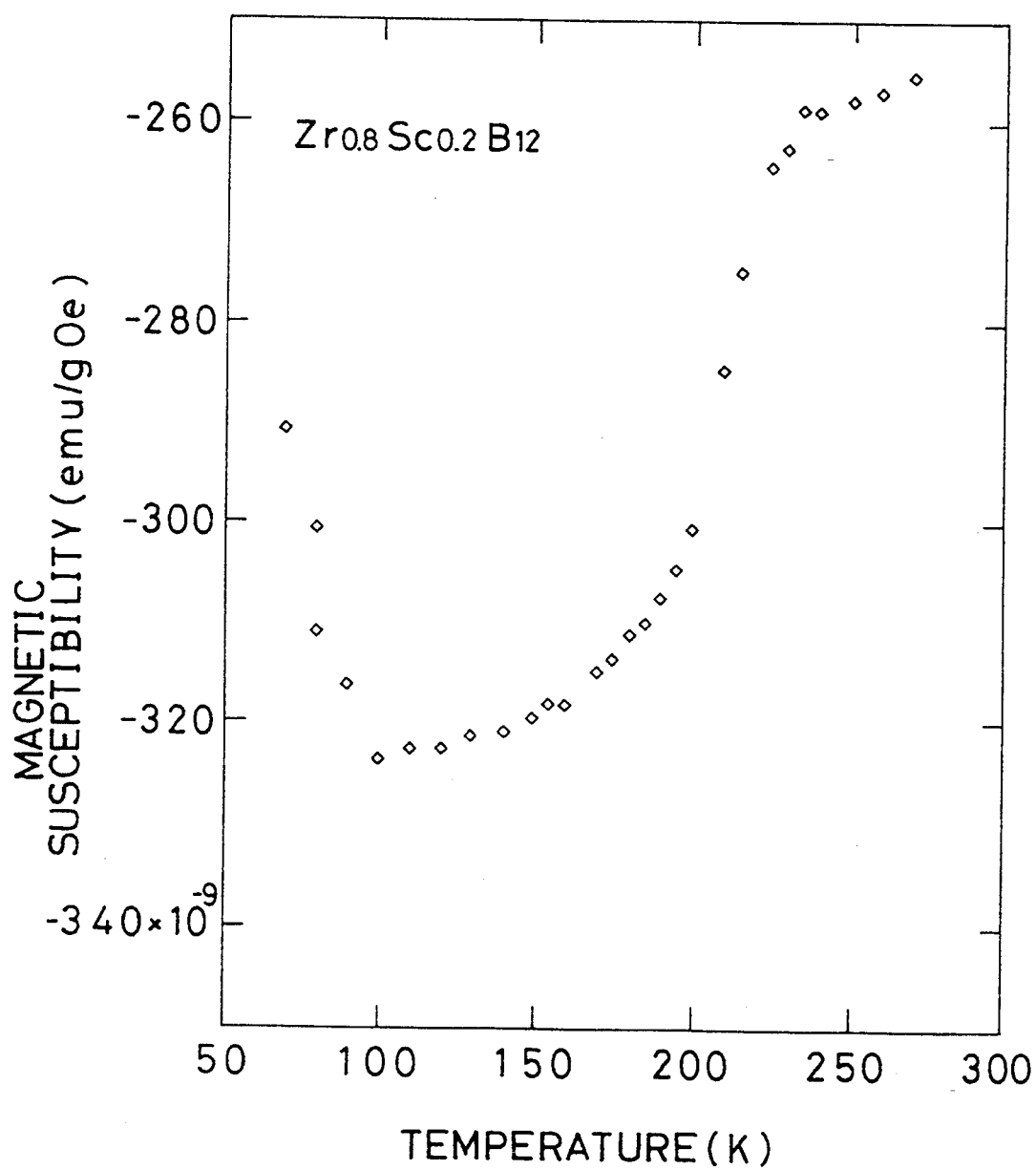
FIG. 9 is a graph of showing the temperature dependence of the magnetic susceptibility of ceramics of $Zr_{0.8}Sc_{0.2}B_{12}$.

FIG. 9 shows the temperature dependence of the magnetic susceptibility of a sample of satisfying x=0.2.

From FIG. 9, it is noted that the diamagnetism of the sample with x=0.2 began to increase at 230° K. The temperature corresponds to the phase transition temperature of the sample with x=0.2 in FIG. 7.

From FIGS. 7 and 4, the phase transition temperature of the sample with x=0.15 is noted to be about 200° K. and that of the sample with x=0.2 to be 230° K. From the data, it is understood that the phase transition temperatures of the samples are shifted to a higher temperature range with increase of x.

While the invention has been described in detail and with reference to specific embodiments thereof, it will be apparent to one skilled in the art that various changes and modifications can be made therein without departing from the spirit and scope thereof.

What is claimed is:

1. A boride material for electronic elements, which is represented by a chemical formula of $A_{1-x}E_xB_{12}$ (where A is Zr of Hf, E is Sc or Y, and $0.1 \leq x \leq 0.9$) and the crystal system of which is a cubic one at a temperature not lower than its phase transition temperature and is a hexagonal one at a temperature not higher than its phase transition temperature.

2. The boride material for electronic elements as claimed in claim 1, which is represented by a chemical formula of $A_{1-x}E_xB_{12}$ (where A is Zr of Hf, E is Sc or Y, and $0.15 \leq x \leq 0.8$).

3. A method of producing a boride material for electronic elements, which material is represented by a chemical formula of $A_{1-x}E_xB_{12}$ (where A is Zr of Hf, E is Sc or Y, and $0.1 \leq x \leq 0.9$) and the crystal system of which material is a cubic one at a temperature not lower than its phase transition temperature and is a hexagonal one at a temperature not higher than its phase transition temperature; the method being characterized in that oxide powders or sulfate powders of the constitutive elements A and E and a boron powder are mixed and then shaped and the shaped body is sintered in a vacuum of $10^{-2}$ torr or less at a temperature of not lower than 1800° C. to give the boride material.

* * * * *